United States Patent
Fujiwara et al.

(10) Patent No.: US 8,216,417 B2
(45) Date of Patent: Jul. 10, 2012

(54) SUBSTRATE TREATING APPARATUS AND SUBSTRATE TREATING METHOD

(75) Inventors: Kunio Fujiwara, Kyoto (JP); Junichi Yoshida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 601 days.

(21) Appl. No.: 12/410,049

(22) Filed: Mar. 24, 2009

(65) Prior Publication Data

US 2009/0242517 A1    Oct. 1, 2009

(30) Foreign Application Priority Data

Mar. 27, 2008 (JP) ................. 2008-083917
Jul. 29, 2008 (JP) ................. 2008-194789

(51) Int. Cl.
*B08B 3/02* (2006.01)
*C03C 15/00* (2006.01)
*C23F 1/00* (2006.01)

(52) U.S. Cl. ............... 156/345.15; 156/345.21; 134/34; 134/135; 134/57 R (58) Field of Classification Search ............... 134/34, 134/135, 57 R; 156/345.15, 345.17, 345.21, 156/345.24, 345.12

See application file for complete search history.

(56) References Cited

U.S. PATENT DOCUMENTS

| | | | |
|---|---|---|---|
| 2006/0060232 A1* | 3/2006 | Tsurusaki et al. | 134/56 R |
| 2007/0215172 A1 | 9/2007 | Watanabe et al. | |
| 2008/0023444 A1 | 1/2008 | Osawa | |
| 2008/0035182 A1 | 2/2008 | Nakatsukasa et al. | |
| 2009/0179007 A1 | 7/2009 | Tsurusaki et al. | |
| 2009/0242517 A1* | 10/2009 | Fujiwara et al. | 216/92 |

FOREIGN PATENT DOCUMENTS

| | | |
|---|---|---|
| JP | 2006186310 | 7/2006 |
| JP | 2008-53680 | 3/2008 |
| KR | 10-2007-0093894 | 9/2007 |
| WO | 2005/100637 | 10/2005 |

OTHER PUBLICATIONS

Korean Office Action dated Nov. 15, 2010 in connection with corresponding Korean Patent Application No. 10-2009-0011468.

* cited by examiner

*Primary Examiner* — Sylvia R. MacArthur
(74) *Attorney, Agent, or Firm* — Ostrolenk Faber LLP (57) ABSTRACT

A substrate treating apparatus for performing a predetermined treatment of substrates with a treating liquid. The apparatus includes a treating tank for storing the treating liquid; a lifter having holding elements for holding the substrates, and vertically movable between a standby position above the treating tank and a treating position inside the treating tank; lower nozzles arranged on opposite sides at a bottom of the treating tank for supplying the treating liquid; upper nozzles arranged above the lower nozzles for supplying the treating liquid toward the holding elements of the lifter; and a control device for controlling a flow ratio of the treating liquid between the upper nozzles and the lower nozzles according to the treatment.

18 Claims, 6 Drawing Sheets

SUBSTRATE TREATING APPARATUS AND SUBSTRATE TREATING METHOD

BACKGROUND OF THE INVENTION (1) Field of the Invention

This invention relates to a substrate treating apparatus and a substrate treating method for immersing semiconductor wafers or glass substrates for liquid crystal displays (hereinafter referred to simply as substrates) in a treating liquid to perform a predetermined treatment of the substrates.

(2) Description of the Related Art

Conventionally, this type of apparatus includes a treating tank having an inner tank for storing a treating liquid and an outer tank for collecting the treating liquid overflowing the inner tank; a lifter vertically movable between a standby position above the treating tank and a treating position inside the inner tank and having holding elements for holding substrates; and a pair of upper nozzles and a pair of lower nozzles for supplying the treating liquid, the lower nozzles being arranged on opposite sides at a bottom of the inner tank, and the upper nozzles being arranged above the lower nozzles (see Japanese Unexamined Patent Publication No. 2008-53680, for example).

After moving the substrates with the lifter to the treating position, the above apparatus performs cleaning treatment by supplying a treating solution such as a sulfuric acid/hydrogen peroxide mixture (SPM) from the upper and lower nozzles. The flows of the solution supplied from the upper nozzles are directed toward the holding elements of the lifter, thereby removing particles tending to remain on these elements.

The conventional apparatus with the above construction has the following problem.

The conventional apparatus has a problem that, depending on a flow ratio of the treating liquid between the upper and lower nozzles, liquid-borne particle removal efficiency can be reduced.

SUMMARY OF THE INVENTION

This invention has been made having regard to the state of the art noted above, and its object is to provide a substrate treating apparatus and a substrate treating method that can improve liquid-borne particle removal efficiency by optimizing a flow ratio between upper and lower nozzles according to treatment.

The above object is fulfilled, according to this invention, by a substrate treating apparatus for performing predetermined types of treatment of substrates with a treating liquid, the apparatus comprising a treating tank for storing the treating liquid; a lifter having holding elements for holding the substrates, and vertically movable between a standby position above the treating tank and a treating position inside the treating tank; lower nozzles arranged on opposite sides at a bottom of the treating tank for supplying the treating liquid; upper nozzles arranged above the lower nozzles for supplying the treating liquid toward the holding elements of the lifter; and a control device for controlling a flow ratio of the treating liquid between the upper nozzles and the lower nozzles according to the treatment.

According to this invention, the control device controls the flow ratio of the treating liquid between the upper nozzles and lower nozzles, so that vortexes having an appropriate size can be produced adjacent the holding elements of the lifter in the treating tank. Thus, the size of vortexes can be controlled to suitably form flows of the treating liquid upward from lower areas in the treating tank, thereby improving liquid-borne particle removal efficiency.

In this invention, the control device may set the flow ratio in a range of 1:5 to 1:1 when cleaning the substrates with the treating liquid.

In cleaning treatment, the flow ratio set to be in the range of 1:5 to 1:1 will produce vortexes having an appropriate size adjacent the holding elements of the lifter in the treating tank, thereby improving liquid-borne particle removal efficiency.

Moreover, the control device may set the flow ratio to 1:2 when cleaning the substrates with the treating liquid.

In cleaning treatment, the above flow ratio will produce vortexes of an optimal size adjacent the holding elements of the lifter in the treating tank, thereby realizing the best liquid-borne particle removal efficiency.

Furthermore, in this invention, the control device may set the flow ratio to 5:1 when etching the substrates with the treating liquid.

In etching treatment, the above flow ratio will produce large vortexes in the treating tank, thereby agitating the treating liquid over wide ranges. As a result, unevenness of the treating liquid contacting the substrates can be suppressed, and uniformity of treatment over the surfaces of the substrates can be improved.

In this invention, the upper nozzles may be arranged in a posture for directing liquid flows toward the holding elements of the lifter.

Then, the liquid flows can be directed toward the vicinity of the holding elements where particles tend to remain, thereby further improving liquid-borne particle removal efficiency.

BRIEF DESCRIPTION OF THE DRAWINGS

For the purpose of illustrating the invention, there are shown in the drawings several forms presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
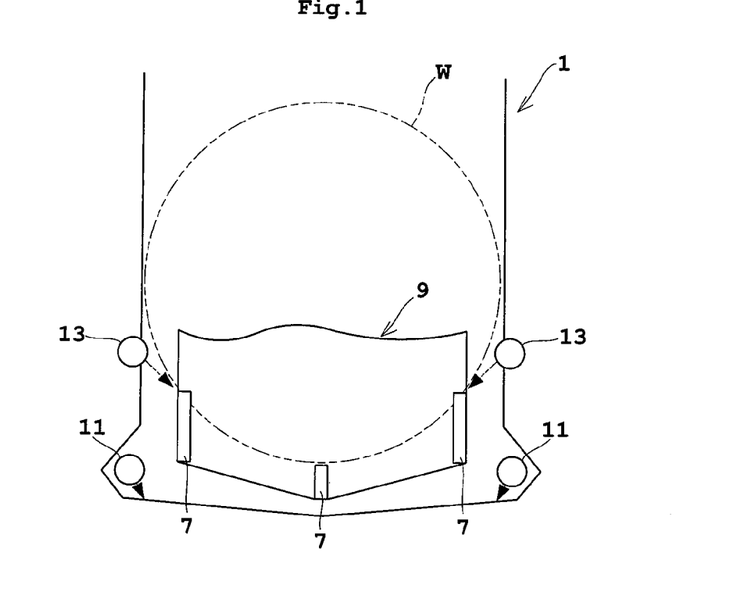
FIG. 1 is a schematic view in vertical section showing a treating tank and associated elements of a substrate treating apparatus according to this invention.
Figure 2:
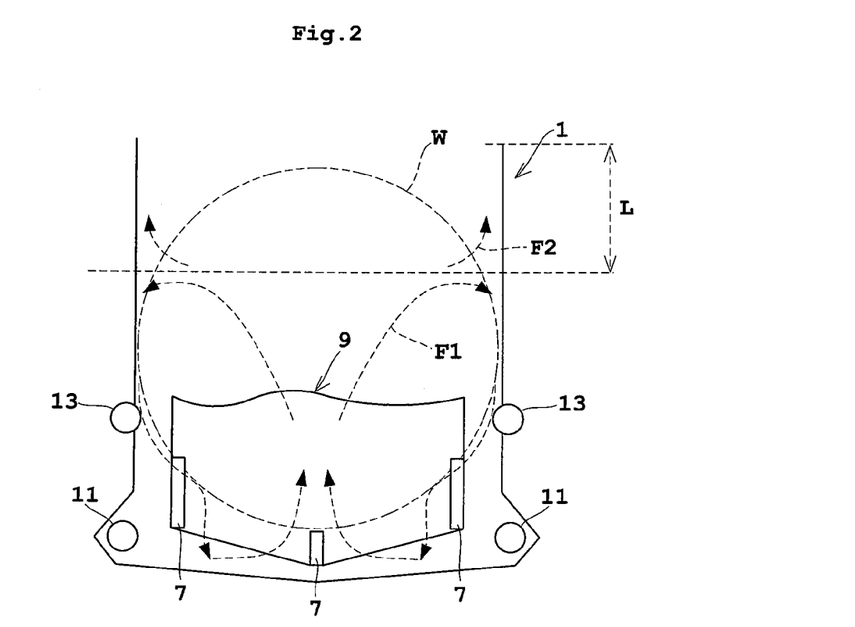
FIG. 2 is a schematic view showing flows of a treating liquid in the treating tank of the substrate treating apparatus according to this invention.

FIG. 1 is a schematic view in vertical section showing a treating tank and associated elements of a substrate treating apparatus according to this invention. FIG. 2 is a schematic view showing flows of a treating liquid in the treating tank of the substrate treating apparatus according to this invention.

The substrate treating apparatus includes a treating tank 1 for storing a treating liquid, a lifter 9 vertically movable between a position inside the treating tank 1 and a position above the treating tank 1, and having three holding elements 7 for holding substrates or wafers W, lower nozzles 11 arranged on opposite sides at a bottom of the treating tank 1 for supplying the treating liquid toward the bottom of the treating tank 1, and upper nozzles 13 arranged above the lower nozzles 11 for supplying the treating liquid toward the holding elements 7 on opposite sides among the three holding elements 7.

The upper nozzles 13 are provided for producing vortexes in the treating liquid stored in the treating tank 1 to eliminate exfoliations, particles and so on separating from the wafers W in cleaning treatment and tending to remain between the wafers W and holding elements 7. The upper nozzles are arranged to form a pair on right and left walls of the treating tank 1, and to extend perpendicular to the plane of FIGS. 1 and 2. Similarly, the lower nozzles 11 are arranged to form a pair as are the upper nozzles 13.

Each of the upper nozzles 13 and lower nozzles 11 can control a flow rate. Thus, by varying a flow ratio between the upper nozzles 13 and lower nozzles 11, liquid flows can be produced in the treating liquid stored in the treating tank 1. For example, a certain flow ratio generates flows as shown in FIG. 2. Specifically, flows F1 are generated to ascend from the center of the bottom of the treating tank 1 and separate right and left, and flows F2 to move above the flows F1 and upward in the treating tank 1. A distance L from a boundary between these flows F1 and F2 to the upper edge of the treating tank 1 is approximately proportional to an amount of the treating liquid discharged from the treating tank 1. In other words, this distance L is relevant to liquid-borne particle removal efficiency (PRE) which is the capability of removing particles from the treating tank 1.

Figure 3:
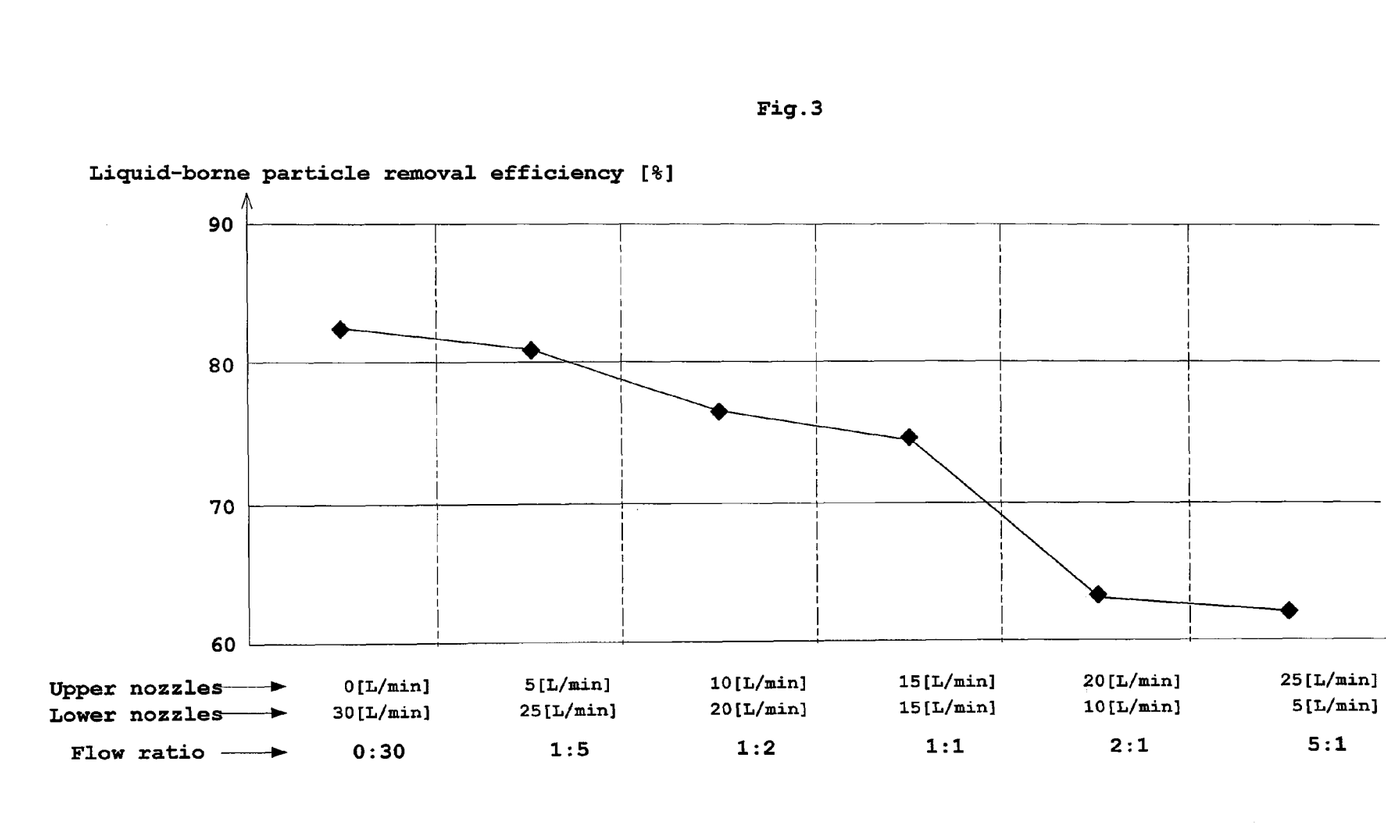
FIG. 3 is a graph showing variations with flow ratios of liquid-borne particle removal efficiency.

Inventors have conducted experiments, by varying the flow ratio which is a ratio of feeding the treating liquid between the upper nozzles 13 and the lower nozzles 11, to find out what quantities of a known number of particles deliberately mixed into the treating liquid are removed from the treating tank 1 in one minute. FIG. 3 shows the results. FIG. 3 is a graph showing variations with flow ratios of liquid-borne particle removal efficiency. FIGS. 4A through 4F are schematic views each showing liquid flows for a different flow ratio in FIG. 3. These schematic views in FIGS. 4A through 4F show rough vector distribution maps of flow velocities in the treating tank 1 determined by computer simulation.

Figure 4A:
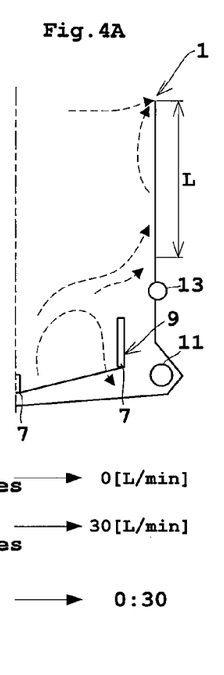
FIGS. 4A through 4F are schematic views each showing liquid flows for a different flow ratio in FIG. 3.
Figure 4B:
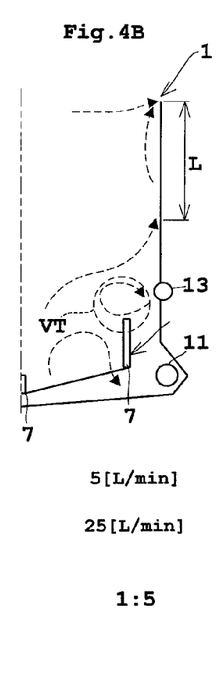
Figure 4C:
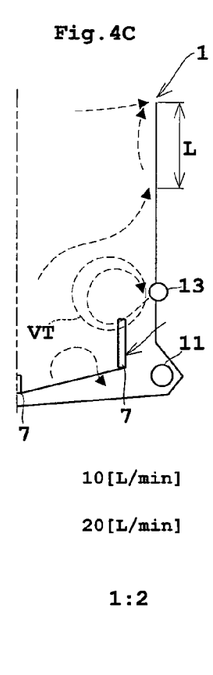
Figure 4D:
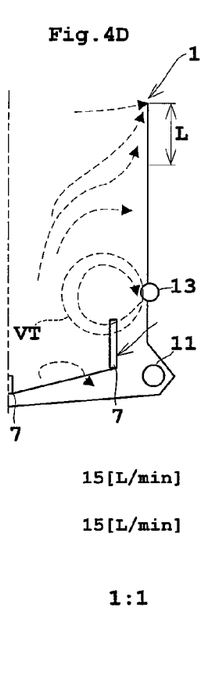
Figure 4E:
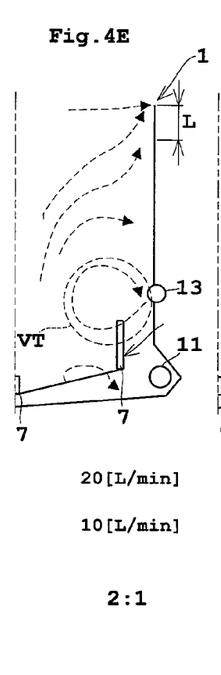
Figure 4F:
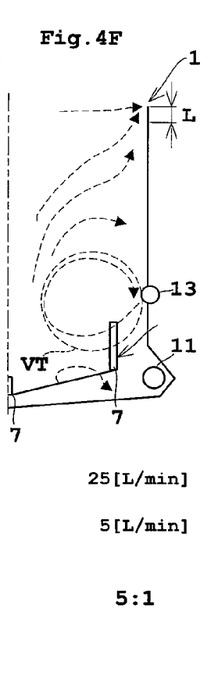

It is seen from the graph of FIG. 3 that, when the flow ratios between the upper nozzles 13 and lower nozzles 11 are 2:1 and 5:1, the liquid-borne particle removal efficiency is extremely low, compared with the other flow ratios. In addition, as shown in FIG. 4A, when the flow ratio is 0:30, there is no liquid flow from the upper nozzles 13, thereby producing no vortex adjacent the holding elements 7. In this case, the distance L becomes long and liquid-borne particle removal efficiency is good, but particles may remain adjacent the holding elements 7. Therefore, this flow ratio of 0:30 is unsuitable.

At a flow ratio of 1:5 (FIG. 4B), a flow ratio of 1:2 (FIG. 4C), and a flow ratio of 1:1 (FIG. 4D), vortexes VT are produced adjacent the right-hand holding element 7, and thus particles tending to remain adjacent the holding elements 7 are removed. In addition, the distance L is long enough to remove particles. Therefore, these flow ratios are suitable for good liquid-borne particle removal efficiency.

On the other hand, at the flow ratio of 2:1 (FIG. 4E) leading to poor liquid-borne particle removal efficiency, large vortexes VT are produced, but the distance L becomes too short instead, thereby reducing the particle removal efficiency. Similarly, larger vortexes VT are produced at the flow ratio of 5:1 (FIG. 4F) than at the flow ratio of 2:1, but the distance L becomes too short instead, thereby reducing the particle removal efficiency. However, this flow ratio of 2:1 is superior to the other flow ratios in the action of agitating the treating liquid with large vortexes VT.

It is understood from the results of the above experiments that, in cleaning treatment where priority is given to removal of exfoliations and particles from the wafers W, the higher liquid-borne particle removal efficiency is the better. It is thus preferable to set the flow ratio between the upper nozzles 13 and lower nozzles 11 to a range of 1:5 to 1:1. On the other hand, in etching treatment where priority is given to uniformity of treatment over the surfaces of wafers W achieved by agitating the treating liquid to suppress unevenness of the liquid, large vortexes VT is preferred to the liquid-borne particle removal efficiency noted above. It will be seen, therefore, the flow ratio between the upper nozzles 13 and lower nozzles 11 should preferably be 5:1 or more for etching treatment.

<Substrate Treating Apparatus>

Figure 5:
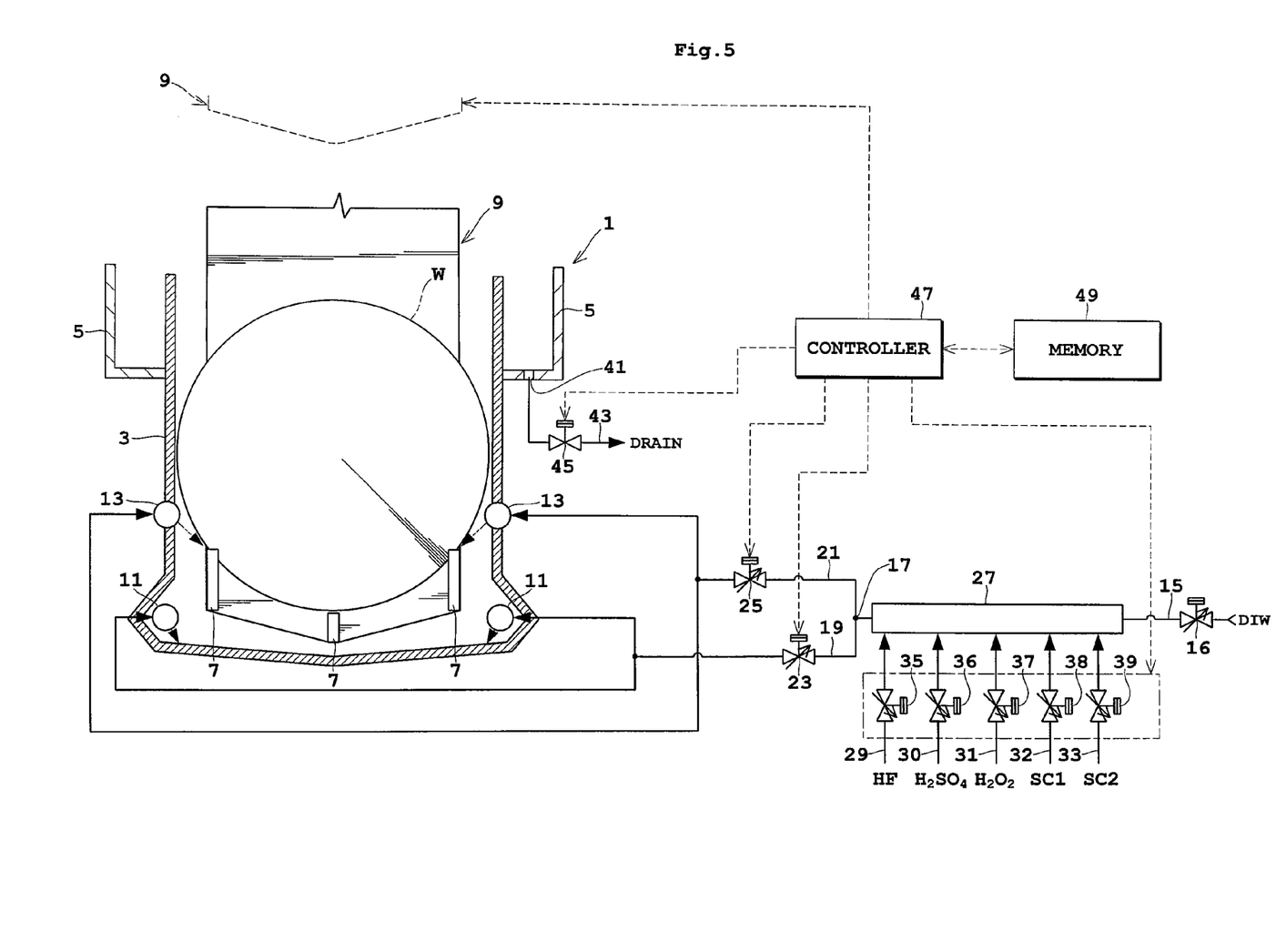
FIG. 5 is a block diagram showing an outline of the substrate treating apparatus according to this invention.

The construction of the substrate treating apparatus according to this invention will be described with reference to FIG. 5. FIG. 5 is a block diagram showing an outline of the substrate treating apparatus according to this invention.

The treating tank 1 includes an inner tank 3 and an outer tank 5. The inner tank 3 stores a treating liquid, and receives wafers W for treatment of the wafers W. Part of the treating liquid overflowing the upper edge of the inner tank 3 is collected by the outer tank 5. The lifter 9 having three holding elements 7 for holding the wafers W in upstanding posture is vertically movable between a treating position in the inner tank 3 (shown in solid lines in FIG. 5) and a standby position above the inner tank 3 (shown in two-dot chain lines in FIG. 5).

The lower nozzles 11 are arranged on opposite sides at the bottom of the inner tank 3. The lower nozzles 11 are arranged at the bottom of the inner tank 3, with injection ports (not shown) directed to supply the treating liquid toward the bottom of the inner tank 3. The upper nozzles 13 are arranged above the lower nozzles 11. The upper nozzles 13 are arranged on the side walls of the inner tank 3, with injection ports (not shown) directed toward the holding elements 7 to supply the treating liquid to the holding elements 7 on the opposite sides among three holding elements 7 of the lifter 9 in the treating position. The upper nozzles 13 and lower nozzles 11 have longitudinal axes extending in the direction of depth in FIG. 5.

One end of a supply pipe 15 is connected to a deionized water source (DIW), and the other end thereof to a junction 17. The supply pipe 15 has a flow control valve 16 mounted thereon for controlling the flow rate of deionized water. The junction 17 has, connected thereto, one end of a first branch pipe 19 and one end of a second branch pipe 21. The other end of the first branch pipe 19 is connected to the lower nozzles 11. The other end of the second branch pipe 21 is connected to the upper nozzles 13. The first branch pipe 19 has a flow control valve 23 mounted thereon for controlling flow rate, while the second branch pipe 21 has a similar flow control valve 25 mounted thereon.

The supply pipe 15 has a mixing valve 27 mounted thereon. The mixing valve 27 has, connected thereto, five chemical supply pipes 29 to 33 connected to five chemical sources, respectively. The chemical supply pipes 29 to 33 have flow control valves 35 to 39 mounted thereon, respectively. The chemical sources in this embodiment are, for example, those of hydrofluoric acid (HF), sulfuric acid ($H_2SO_4$), hydrogen peroxide solution ($H_2O_2$), SC1 (Standard Clean 1: mixture of ammonia water and hydrogen peroxide solution), and SC2 (Standard Clean 2: mixture of hydrochloric acid and hydrogen peroxide solution).

A drain port 41 is formed at the bottom of the outer tank 5 mentioned hereinbefore. One end of a drain pipe 43 is connected to the drain port 41, and the other end thereof is connected to waste-liquid treatment equipment (not shown). The drain pipe 43 has a switch valve 45 mounted thereon.

A controller 47 carries out overall control of the operation of the apparatus, including the vertical movement of the lifter 9, flow control operations of the flow control valves 16, 23, 25, and 35 to 39, and opening and closing of the switch valve 45. The controller 47 has a memory 49 connected thereto. The memory 49 stores the flow ratios noted hereinbefore for different types of treatment. Specifically, the flow ratios include, for example, the flow ratio=1:2 between the upper nozzles 13 and lower nozzles 11 for cleaning treatment, and the flow ratio=5:1 between the upper nozzles 13 and lower nozzles 11 for etching. The controller 47 determines a type of treatment based on a recipe specified by the operator, reads a flow ratio for the treatment from the memory 49, and controls the flow rates of the flow control valves 23 and 25.

The controller 47 noted above corresponds to the "control device" in this invention.

<Example of Cleaning Treatment>

Figure 6:
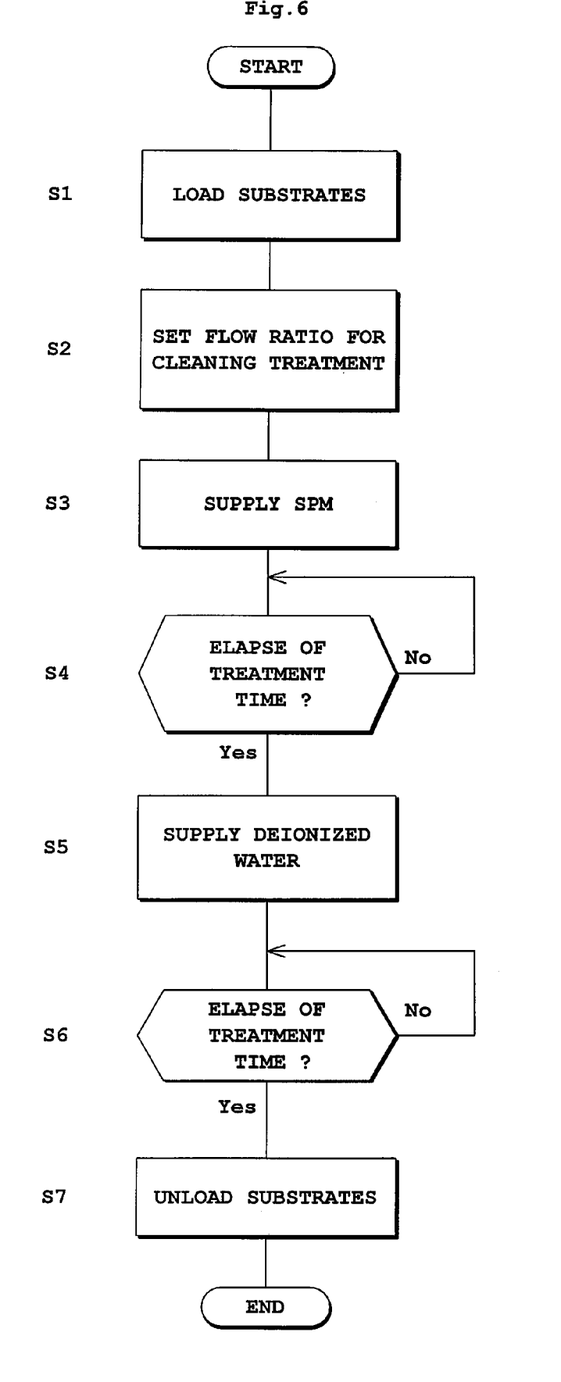
FIG. 6 is a flow chart showing an example of cleaning treatment.

An example of cleaning wafers W with the above substrate treating apparatus will now be described hereinafter. FIG. 6 is a flow chart showing an example of cleaning treatment.

Step S1

The controller 47 moves the lifter 9 holding wafers W to be treated, from the standby position to the treating position.

Step S2

The controller 47 determines a type of treatment based on a recipe already specified by the operator, reads a flow ratio according to the treatment from the memory 49, and sets the flow control valves 23 and 25. Specifically, the flow ratio between the upper nozzles 13 and lower nozzles 11 is set to 1:2.

Step S3

The flow control valves 36 and 37 are controlled, with the flow control valve 16 kept closed, to produce a mixture of sulfuric acid and hydrogen peroxide solution (SPM), and supply the mixture into the inner tank 3. At this time, the SPM is supplied into the inner tank 3 with the flow ratio between the upper nozzles 13 and lower nozzles 11 set to 1:2. The SPM overflowing the inner tank 3 is collected by the outer tank 5, and discharged through the drain pipe 43.

Step S4

The supply of the SPM into the inner tank 3 is continued for a predetermined period specified in the recipe.

Steps S5 and S6

Upon completion of the treatment with the SPM, the controller 47 closes the flow control valves 36 and 37. Subsequently, the controller 47 controls the flow control valve 16 to supply deionized water into the inner tank 3. At this time, the flow ratio between the upper nozzles 13 and lower nozzles 11 is maintained at 1:2. By keeping this state for a treatment time, the deionized water pushes up and replaces the SPM in the inner tank 3, thereby removing the SPM with the deionized water.

Step S7

When the treatment with the deionized water is over, the controller 47 raises the lifter 9 from the treating position to the standby position to complete the treatment.

The cleaning treatment of the wafers W is carried out through the above series of steps. The controller 47 adjusts the flow ratio between the upper nozzles 13 and lower nozzles 11 to 2:1, thereby producing vortexes of appropriate size necessary for removing particles tending to remain adjacent the holding elements 7 of the lifter 9 in the inner tank 3. As a result, flows of the treating liquid can be appropriately formed to move upward from lower areas within the inner tank 3, thereby improving liquid-borne particle removal efficiency.

In the above description, the flow ratio between the upper nozzles 13 and lower nozzles 11 is set to 1:2. However, similar effects can be produced by any flow ratios in the range of 1:5 to 1:1.

<Example of Etching Treatment>

Figure 7:
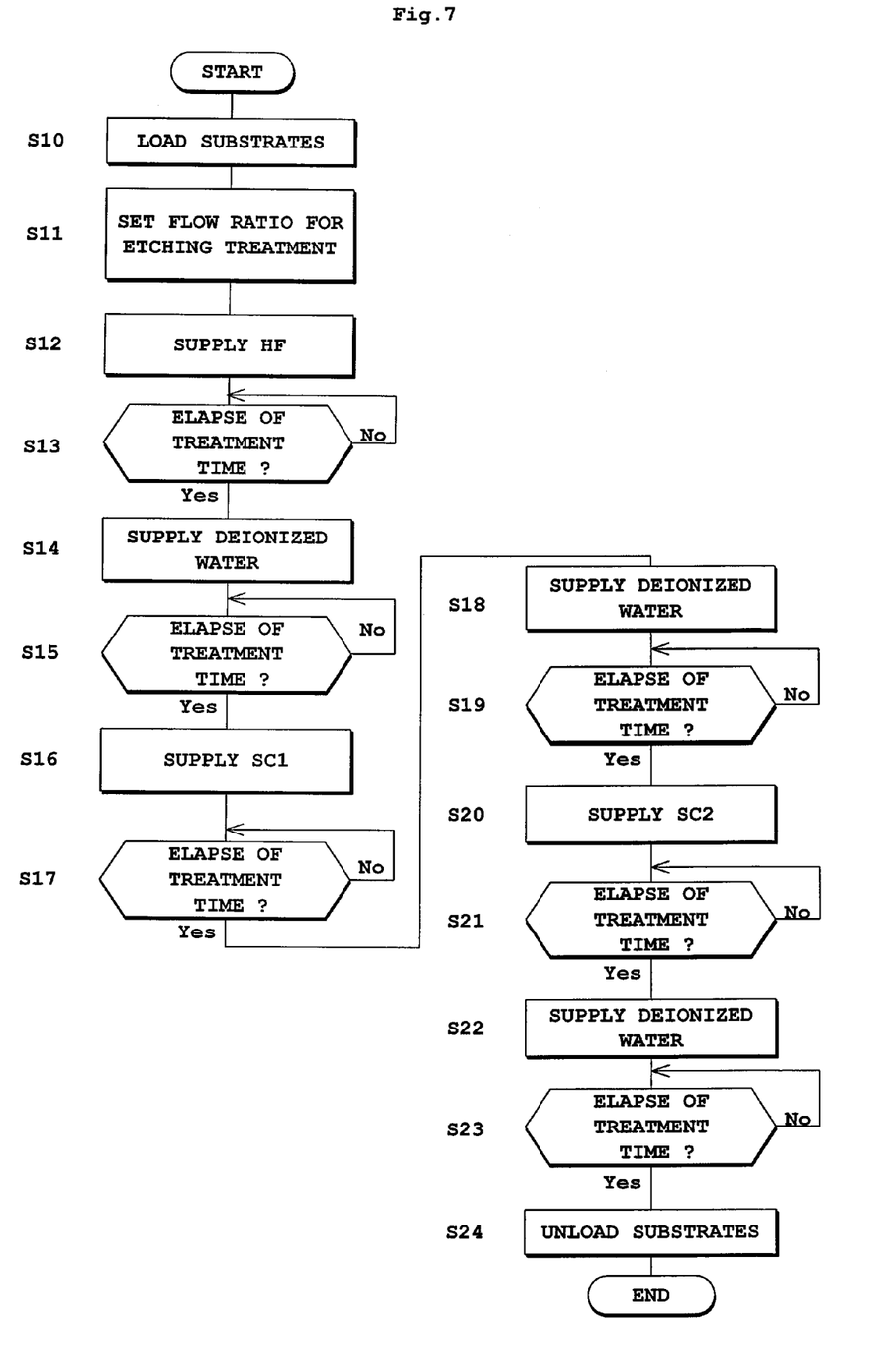
FIG. 7 is a flow chart showing an example of etching treatment.

An example of etching wafers W with the above substrate treating apparatus will now be described hereinafter. FIG. 7 is a flow chart showing an example of etching treatment.

Step S10

The controller 47 moves the lifter 9 holding wafers W to be treated, from the standby position to the treating position in the inner tank 3.

Step S11

The controller 47 determines a type of treatment based on a recipe already specified by the operator, reads a flow ratio according to the treatment from the memory 49, and sets the flow control valves 23 and 25. Specifically, the flow ratio between the upper nozzles 13 and lower nozzles 11 is set to 5:1.

Steps S12 and S13

The controller 47 controls the flow control valve 16 to a predetermined flow rate and also controls the flow control valve 35, thereby producing a hydrofluoric acid solution (HF) of a predetermined concentration and supplying it into the inner tank 3. At this time, the HF is supplied into the inner tank 3 with the flow ratio between the upper nozzles 13 and lower nozzles 11 set to 5:1. The HF overflowing the inner tank 3 is collected by the outer tank 5, and discharged through the drain pipe 43. This state is kept for a treatment time specified in the recipe.

Steps S14 and S15

Upon completion of the treatment with the HF, the controller 47 closes the flow control valve 35. Subsequently, the controller 47 controls the flow control valve 16 to supply deionized water into the inner tank 3. At this time, the flow ratio between the upper nozzles 13 and lower nozzles 11 is maintained at 5:1. By keeping this state for a treatment time, the HF in the inner tank 3 is replaced while being agitated by the deionized water, whereby the HF is removed by the deionized water. This state is kept for a treatment time specified in the recipe.

Steps S16 and S17

The controller 47 closes the flow control valve 16, and also controls the flow control valve 38 to supply SC1 of a predetermined concentration into the inner tank 3. At this time, the SC1 is supplied into the inner tank 3 with the flow ratio between the upper nozzles 13 and lower nozzles 11 set to 5:1. The SC1 overflowing the inner tank 3 is collected by the outer tank 5, and discharged through the drain pipe 43. This state is kept for a treatment time specified in the recipe.

Steps S18 and S19

After the treatment with the SC1, the controller 47 closes the flow control valve 38. Subsequently, the controller 47 controls the flow control valve 16 to supply deionized water into the inner tank 3. By keeping this state for a treatment time, the SC1 in the inner tank 3 is replaced while being agitated by the deionized water, whereby the SC1 is removed by the deionized water. This state is kept for a treatment time specified in the recipe.

Steps S20 and S21

The controller 47 closes the flow control valve 16 to a predetermined flow rate and also controls the flow control valve 39, thereby supplying SC2 of a predetermined concentration into the inner tank 3. At this time, the SC2 is supplied into the inner tank 3 with the flow ratio between the upper nozzles 13 and lower nozzles 11 set to 5:1. The SC2 overflowing the inner tank 3 is collected by the outer tank 5, and discharged through the drain pipe 43. This state is kept for a predetermined treatment time specified in the recipe.

Steps S22 and S23

After the treatment with the SC2, the controller 47 closes the flow control valve 39, and controls the flow control valve 16 to supply deionized water at a predetermined flow rate into the inner tank 3. By keeping this state for a treatment time, the SC2 in the inner tank 3 is replaced while being agitated by the deionized water, whereby the SC2 is removed by the deionized water. This state is kept for a treatment time specified in the recipe.

Step S24

When the treatment with the deionized water is over, the controller 47 raises the lifter 9 from the treating position to the standby position to complete the treatment.

In the above description, the flow ratio between the upper nozzles 13 and lower nozzles 11 is set to 5:1. However, a flow ratio exceeding 5:1 may be set.

In the etching treatment, the controller 47 sets the flow ratio between the upper nozzles 13 and lower nozzles 11 to 5:1 as described above, thereby producing large vortexes in the treating tank 3 to agitate the treating liquid over wide ranges. As a result, unevenness of the treating liquid contacting the wafers W can be suppressed, and the uniformity of the treatment over the surfaces of wafers W can be improved.

The controller 47 sets the flow ratio between the upper nozzles 13 and lower nozzles 11 to 1:2 for cleaning treatment, and switches the flow ratio to 5:1 for etching treatment. This realizes excellent cleaning treatment having priority given to liquid-borne particle removal efficiency, and excellent etching treatment having priority given to liquid agitation.

This invention is not limited to the foregoing embodiment, but may be modified as follows:

(1) In the embodiment described above, the treating liquids supplied to the substrate treating apparatus are discharged from the drain port 41. However, the invention is applicable also to a circulation type configuration in which the drain port 41 and supply pipe 15 are connected for circulating the treating liquids.

(2) In the embodiment described above, chemicals such as HF are supplied via the mixing valve 27 mounted on the supply pipe 15. The invention is not limited to such a configuration as long as each chemical can be supplied to the lower nozzles 11 and upper nozzles 13 in a predetermined flow ratio.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a predetermined treatment of substrates with a treating liquid, the apparatus comprising:
   a treating tank for storing the treating liquid;
   a lifter having holding elements for holding the substrates, and vertically movable between a standby position above the treating tank and a treating position inside the treating tank;
   lower nozzles arranged on opposite sides at a bottom of the treating tank for supplying the treating liquid;
   upper nozzles arranged above the lower nozzles for supplying the treating liquid toward the holding elements of the lifter; and
   a control device operatively connected to the upper and lower nozzles and programmed for supplying the treating liquid from the upper nozzles and the lower nozzles simultaneously and controlling a flow ratio of the treating liquid between the upper nozzles and the lower nozzles according to the treatment.

2. The apparatus according to claim 1, wherein the control device is arranged to set the flow ratio in a range of 1:5 to 1:1 when cleaning the substrates with the treating liquid.

3. The apparatus according to claim 2, wherein the upper nozzles are arranged in a posture for directing liquid flows toward the holding elements of the lifter.

4. The apparatus according to claim 2, further comprising a memory for prestoring flow ratios corresponding to different types of treatment, wherein the control device is programmed to refer to the memory in response to a specified type of treatment and determine which of said prestored flow ratios is to be applied to the upper and lower nozzles.

5. The apparatus according to claim 2, wherein:
   the upper nozzles are connected to a first branch pipe for supplying the treating liquid, the first branch pipe having a flow control valve for controlling a flow rate;
   the lower nozzles are connected to a second branch pipe for supplying the treating liquid, the second branch pipe having a flow control valve for controlling a flow rate; and
   the control device is arranged to operate the flow control valve of the first branch pipe and the flow control valve of the second branch pipe to control the flow rates.

6. The apparatus according to claim 1, wherein the control device is arranged to set the flow ratio to 1:2 when cleaning the substrates with the treating liquid.

7. The apparatus according to claim 6, wherein the upper nozzles are arranged in a posture for directing liquid flows toward the holding elements of the lifter.

8. The apparatus according to claim 6, further comprising a memory for prestoring flow ratios corresponding to different types of treatment, wherein the control device is programmed to refer to the memory in response to a specified type of treatment, and determine which of said prestored flow ratios is to be applied to the upper and lower nozzles.

9. The apparatus according to claim 6, wherein:
   the upper nozzles are connected to a first branch pipe for supplying the treating liquid, the first branch pipe having a flow control valve for controlling a flow rate;
   the lower nozzles are connected to a second branch pipe for supplying the treating liquid, the second branch pipe having a flow control valve for controlling a flow rate; and
   the control device is arranged to operate the flow control valve of the first branch pipe and the flow control valve of the second branch pipe to control the flow rates.

10. The apparatus according to claim 1, wherein the control device is arranged to set the flow ratio to 5:1 when etching the substrates with the treating liquid.

11. The apparatus according to claim 10, wherein the upper nozzles are arranged in a posture for directing liquid flows toward the holding elements of the lifter.

12. The apparatus according to claim 10, further comprising a memory for prestoring flow ratios corresponding to different types of treatment, wherein the control device is programmed to refer to the memory in response to a specified type of treatment, and determine which of said prestored flow ratios is to be applied to the upper and lower nozzles.

13. The apparatus according to claim 10, wherein:
the upper nozzles are connected to a first branch pipe for supplying the treating liquid, the first branch pipe having a flow control valve for controlling a flow rate;
the lower nozzles are connected to a second branch pipe for supplying the treating liquid, the second branch pipe having a flow control valve for controlling a flow rate; and
the control device is arranged to operate the flow control valve of the first branch pipe and the flow control valve of the second branch pipe to control the flow rates.

14. The apparatus according to claim 1, wherein the upper nozzles are arranged in a posture for directing liquid flows toward the holding elements of the lifter.

15. The apparatus according to claim 14, further comprising a memory for prestoring flow ratios corresponding to different types of treatment, wherein the control device is programmed to refer to the memory in response to a specified type of treatment, and determine which of said flow ratios is to be applied to the upper and lower nozzles.

16. The apparatus according to claim 14, wherein:
the upper nozzles are connected to a first branch pipe for supplying the treating liquid, the first branch pipe having a flow control valve for controlling a flow rate;
the lower nozzles are connected to a second branch pipe for supplying the treating liquid, the second branch pipe having a flow control valve for controlling a flow rate; and
the control device is arranged to operate the flow control valve of the first branch pipe and the flow control valve of the second branch pipe to control the flow rates.

17. The apparatus according to claim 1, further comprising a memory for prestoring flow ratios corresponding to different types of treatment, wherein the control device is programmed to refer to the memory in response to a specified type of treatment, and determine which of said prestored flow ratios is to be applied to the upper and lower nozzles.

18. The apparatus according to claim 1, wherein:
the upper nozzles are connected to a first branch pipe for supplying the treating liquid, the first branch pipe having a flow control valve for controlling a flow rate;
the lower nozzles are connected to a second branch pipe for supplying the treating liquid, the second branch pipe having a flow control valve for controlling a flow rate; and
the control device is arranged to operate the flow control valve of the first branch pipe and the flow control valve of the second branch pipe to control the flow rates.

* * * * *